United States Patent [19]

Phillips et al.

[11] Patent Number: 5,729,501
[45] Date of Patent: Mar. 17, 1998

[54] HIGH SPEED SRAM WITH OR-GATE SENSE

[75] Inventors: Larry Bryce Phillips; Robert Paul Masleid; John Stephen Muhich, all of Austin, Tex.

[73] Assignee: International Business Machines Corporation, Armonk, N.Y.

[21] Appl. No.: 525,939

[22] Filed: Sep. 8, 1995

[51] Int. Cl.[6] .................................................. G11C 8/00
[52] U.S. Cl. ...................... 365/230.03; 365/203; 365/204
[58] Field of Search ................................ 365/154, 49, 203, 365/204, 230.03, 205, 190

[56] References Cited

U.S. PATENT DOCUMENTS

| | | | |
|---|---|---|---|
| 4,528,646 | 7/1985 | Ochii et al. | 365/203 |
| 4,800,552 | 1/1989 | Koshizuka et al. | 365/190 |
| 4,935,901 | 6/1990 | Sasaki et al. | 365/230.03 |
| 4,972,373 | 11/1990 | Kim et al. | 365/203 |
| 4,996,666 | 2/1991 | Duluk, Jr. | 365/49 |
| 4,999,519 | 3/1991 | Kitsukawa et al. | 307/446 |
| 5,051,954 | 9/1991 | Toda et al. | 365/189.02 |
| 5,170,375 | 12/1992 | Mattausch et al. | 365/230.03 |
| 5,172,335 | 12/1992 | Sasaki et al. | 365/63 |
| 5,193,074 | 3/1993 | Anami | 365/230.03 |
| 5,247,479 | 9/1993 | Young | 365/189.05 |
| 5,260,899 | 11/1993 | Yasuda et al. | 365/189.01 |
| 5,276,652 | 1/1994 | Anami | 365/227 |
| 5,285,118 | 2/1994 | Montegari | 307/463 |
| 5,287,314 | 2/1994 | Flannagan et al. | 365/208 |
| 5,327,389 | 7/1994 | Seok et al. | 363/230.03 |
| 5,329,494 | 7/1994 | Suzuki et al. | 365/230.03 |
| 5,357,478 | 10/1994 | Kikuda et al. | 365/230.03 |
| 5,359,572 | 10/1994 | Sato et al. | 365/230.03 |
| 5,363,340 | 11/1994 | Ishikawa et al. | 365/233.5 |
| 5,365,480 | 11/1994 | Yamamura et al. | 365/190 |
| 5,365,483 | 11/1994 | Vinal | 365/203 |
| 5,367,488 | 11/1994 | An | 365/189.01 |
| 5,453,708 | 9/1995 | Gupta et al. | 326/98 |
| 5,517,136 | 5/1996 | Harris et al. | 326/93 |

*Primary Examiner*—Joseph A. Popek
*Attorney, Agent, or Firm*—Sawyer & Associates; Mark E. McBurney

[57] ABSTRACT

A system and method for replacing sense amplifiers used in conventional RAMS with domino circuits in order to create a domino static random access memory. The domino SRAM of the present invention is created through extensive partitioning of conventional bit lines into local bit lines corresponding to the local cell groups within the SRAM. A ratioed inverter is coupled to each one of the local bit lines in a local cell group to form dynamic nodes and to provide a sense function for the local cell group. A tree-hierarchy of Or-gates is coupled to the ratioed inverters to complete the domino circuit.

15 Claims, 2 Drawing Sheets

HIGH SPEED SRAM WITH OR-GATE SENSE

CROSS-REFERENCE TO RELATED APPLICATIONS

The present application is related to applications Ser. No. 08/525,444, entitled "Conditional Recharge for Dynamic Logic" Ser. No. 08/525,444, entitled "Minimal Recharge Overhead Circuit for Domino SRAM Structures," and Ser. No. 08/525,444, entitled "Fast Read Domino SRAM" filed on the same date as the present application and assigned to the assignee of the present application.

FIELD OF THE INVENTION

The present invention relates to random access memories in microprocessor applications, and more particularly to a system and-method for increasing the performance of high-speed static random access memories while decreasing power consumption.

BACKGROUND OF THE INVENTION

Power conservation is a major design objective, even in high performance circuits. High speed embedded static random access memories (SRAMs) in current superscalar processors are straggling to keep up with the processors due to rapidly decreasing processor cycle times and to restrictions on power consumption. As processor designs increase in both the degree of scalarity (number of execution units) and word size, embedded cache SRAMs are both limiting processor speed (or decreasing throughput as latency increases) and contributing significantly to such a chip's power consumption.

The limitations associated with SRAMs are primarily due to conventional SRAM design. A SRAM typically comprises an array of cells. The cells in each column of the array are coupled by two lines, known as bit lines, to a sense amplifier, which reads the information stored in the cells by sensing a small differential voltage across the bit-line pair.

Traditional SRAM designs create several power consumption issues. First, wide line sizes comprising the SRAM circuits greatly increase power consumption by requiring many more-sense amplifiers, and also take away a design freedom. Second, sense amplifiers dissipate a significant amount of power because the transistors used in differential amplifiers must be placed into a linear operating mode until the voltage difference across the bit-line pair exceeds a predetermined threshold. In addition, due to architectural restrictions, sense amplifiers are becoming more difficult to design; and the traditional method of increasing speed in a SRAM is to increase the power supplied to the sense amplifier.

Accordingly, what is needed is a system and method for providing a RAM structure that uses a sense approach that both increases performance and decreases power consumption. The present invention addresses such a need.

SUMMARY OF THE INVENTION

The present invention is a system and method for providing a domino RAM. The system and method comprises a local bit line, precharge means for charging the local bit line, discharge means for discharging the local bit line, and detection means for detecting the discharge of the local bit line. The local bit line, the precharge means, and the detection means defining a dynamic node of the domino random access memory.

According to the system and method disclosed herein, the present invention provides a twenty percent decrease in power consumption over traditional sense amplifier approaches; while maintaining almost a thirty percent speed advantage.

DESCRIPTION OF THE INVENTION

The present invention relates to an improvement in random access memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
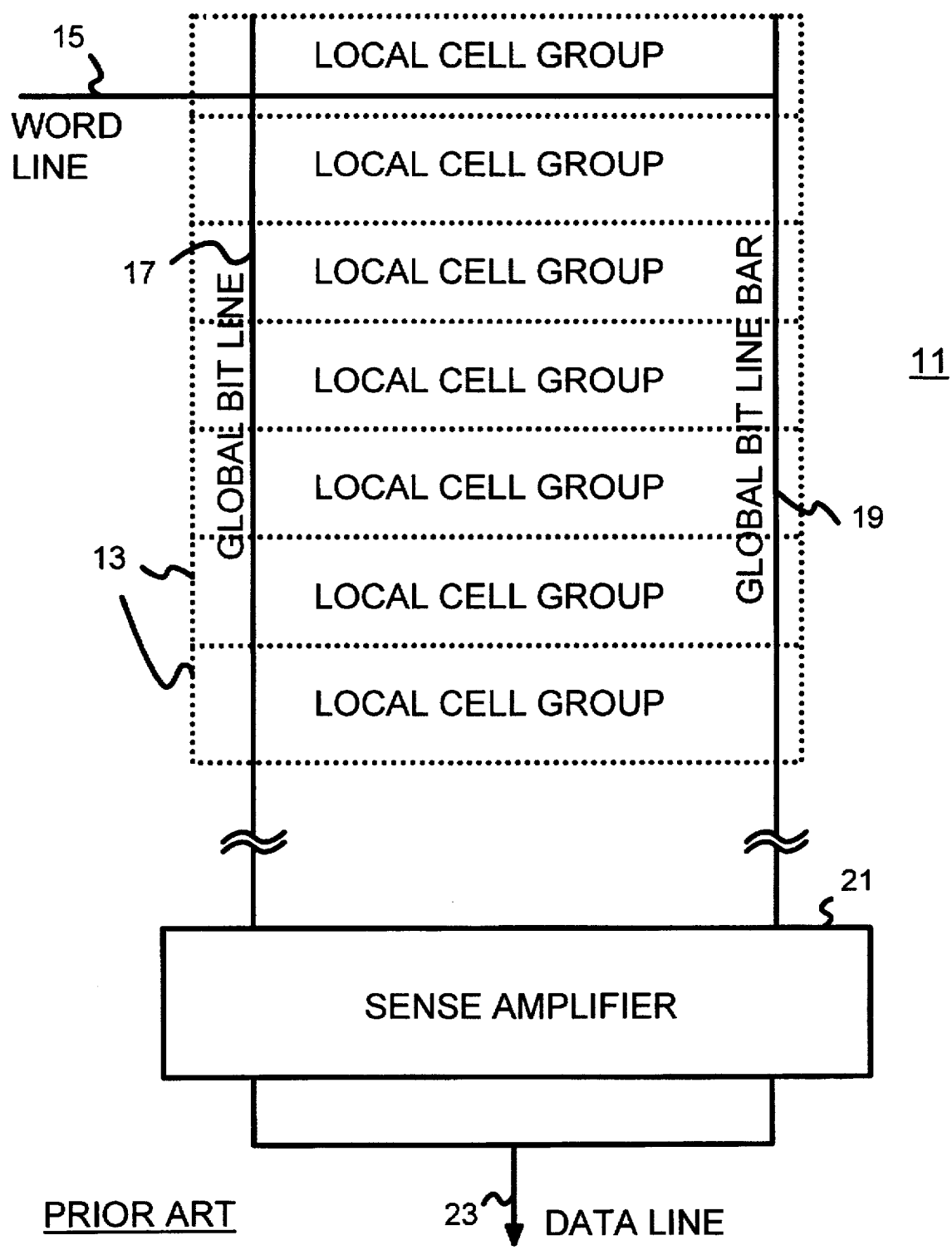
FIG. 1 is a block diagram of a one column array in a prior art SRAM.

Referring to FIG. 1, one column of a prior art SRAM 11 is shown. The SRAM 11 comprises an array of local cell groups 13 that include a number of cells (not shown), where each row of cells in the array constitutes a memory word. Each cell in a row is coupled to a word line 15. The cells in each column are coupled by two lines, known as-global bit lines 17 and 19, to a sense amplifier 21. The sense amplifier 21 is, in turn, coupled to data input-output lines 23 of the chip. During a memory read operation, one of the word lines 15 is activated in a local cell group 13 to select a row of cells to be read. This causes a small change in the voltage across the global bit lines 17 and 19. The sense amplifier 21 is used to amplify the signal from the selected cell to detect a binary 0 or 1, each of which is represented by a particular voltage level. To perform the sense function, the sense amplifier 21 typically requires a reference voltage midway between the two voltage levels, which consumes a relatively large amount of power. This type of reference voltage is called a small swing signal because it is less than the voltage supplied to the chip. After sensing the voltage, the sense amplifier 21 transmits the information read from the cell to the output data lines 23.

Other types of circuits exist besides those traditionally used to make memory circuits. For example, one type of circuits used to make logic circuits, such as those comprising processor logic, are referred to as dynamic circuits. To clarify that dynamic circuits are different from dynamic type memories, dynamic circuits are referred to here as domino circuits. Domino circuits typically include dynamic nodes that are coupled to logic circuits. During a precharge cycle, the dynamic node is precharged with a voltage, and during an evaluation cycle, the logic circuits discharges the dynamic node for evaluation. While domino circuits have long been used to increase performance of logic circuits, they have not been applied to memory circuits.

According to the present invention, sense amplifiers used in conventional RAMs are replaced with domino circuits that are traditionally used in logic circuits, to create a domino SRAM. The domino SRAM of the present invention is created through the extensive partitioning of a global bit line.

Figure 2:
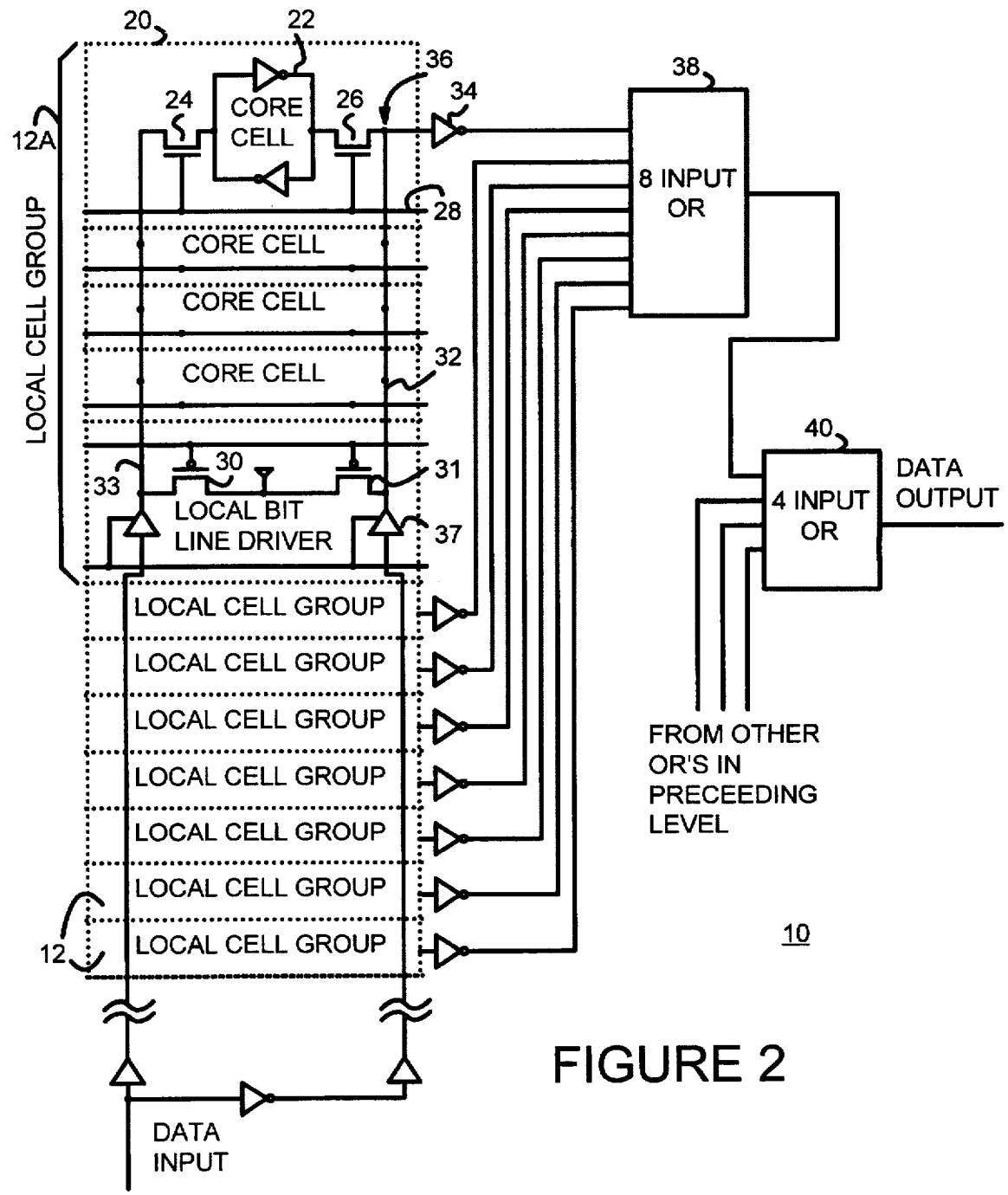
FIG. 2 is a block diagram of a one column array in a SRAM of the present invention.

To more particularly describe the features of the present invention, refer now to FIG. 2 which depicts a block diagram of one column of arrays in an SRAM 10 of the present invention. Each column comprising the SRAM 10 is divided into local cell groups 12. Local cell group 12A is shown in detail to show that in a preferred embodiment of the present invention, each of the local cell groups 12 include four core cells, and a local bit line driver 30 for writing data into the cells. Core cell 20 is also shown in detail to show that each core cell in the SRAM 10 includes a conventional word line 28, two transistors 24 and 26 coupled to the word line 28, and a cross-coupled inverter 22 coupled between two transistors 24 and 26. It is to be understood that all the core cells in the SRAM 10 have the same structure as core cell 20, and that all the local cell groups 12 have the same structure as local cell group 12A.

According to the present invention, sense amplifiers used in conventional SRAMs are replaced in the SRAM 10 by partitioning the conventional global bit lines 17 and 19 of FIG. 1 into two local bit lines 33 and 32 for each of the local cell groups 12. The partitioning of global bit lines includes coupling a precharge device 30 to the local bit line 33, and coupling a second precharge device 31 and a ratioed inverter 34 to the local bit line 32.

The combination of the local bit line 32, the precharge device 31, and the ratioed inverter 34 transforms the conventional global bit line 19 of FIG. 1 into a dynamic node 36 of a domino circuit. During precharge cycle, the precharge device 31 functions to precharge the dynamic node 36 with a voltage. The dynamic node 36, which is also called a dynamic dot-OR node, is the mechanism for achieving an Or-function when a local cell group 12 is read during an evaluation cycle. A core cell 20 within a local cell group 12A is read by activating the word line 28 for the core cell 20 to be read. This causes the cross-coupled inverter 22 and the transistor 26 associated with the word line 28 to produce a full swing voltage on the local bit line 32 that switches between Vdd and ground (i.e., operating on the voltage supplied to the chip, rather than on some reduced swing signal). In response to the full swing voltage produced by any one of the four core cells, the dynamic node 36 discharges, producing the Or-function. The discharge from the dynamic node 36 then causes the ratioed inverter 34 associated with the local cell group 12A to discharge, providing the sense function for the cell group 12A.

In this configuration, the set of four transistor 26 from the four core cells 20 within the local cell group 12A drive the local bit line 32. Driving the local bit line 32 using only the four core cells 20 within a local cell group 12 is in contrast to a conventional SRAM in which all the core cells in a column drive two global bit lines.

In another preferred embodiment of the present invention, only the global bit line 19 of FIG. 1 is partitioned into a local bit line for each local cell group 12, rather than partitioning both global bit lines 17 and 19. Partitioning both global bit lines, however, into two local bit lines further lowers power dissipation of the SRAM 10.

The ratioed inverter 34 may be adjusted to discharge at different points determined by a trade-off between speed and noise immunity. The ratio of the ratioed inverter 34 causes the inverter 34 to switch at a higher input voltage and therefore sooner. The ratioed inverter 34 may also be adjusted to minimize local bit line 32 capacitance. In a preferred embodiment, the ratioed inverter 34 is set to switch when the dynamic node 36 reaches three-quarters to two-thirds of Vdd. As will be recognized by one skilled in the art, a static inverter, rather than a ratioed inverter may also be used, in which case, the inverter would switch when the dynamic node 36 reaches one-half Vdd.

Each of the inverters 34 corresponding to a local cell group 12A drive an Or-gate tree hierarchy of the domino circuit to produce output data. The output of each ratioed inverter 34 is input to an eight-way input-Or 38, and the output of the eight-way input-Or 38 is input into a four-way input-Or 40, creating a one hundred and twenty-eight line array. As shown, the present invention replaces sense amplifiers with a domino circuit comprising a hierarchy of Or-gates, where the first level of Or-gates is integrated into the SRAM core cell structure.

The SRAM 10 of the present invention reduces power consumption because power is dissipated by the Or-gate tree only when reading a "1" from a core cell. Power is not dissipated by the Or-gate tree when a "0" is read because reading a "0" prevents transistor 26 from discharging the dynamic node 36. When the dynamic node 36 does not discharge after the word line 28 has been activated during an evaluation cycle to read a cell, the dynamic node 36 is assumed to have read a "0."

A conventional sense amplifier, in contrast, dissipates power whether reading a "1" or a "0" because they can only sense differential signals, not unipolar signals. Furthermore, as stated above, the ratioed inverter 34 operates on full swing signal, rather operating on a small voltage swing, such as 100 Mv for example, as do conventional sense amplifiers. This allows all the transistors in the present invention to operate in fully saturated mode (fully on or off), as distinguished from a sense amplifier which sense an intermediate voltage.

In the present invention, the conventional global bit line 19 of FIG. 1 is partitioned into local bit lines 32 of tree-hierarchy of Or-gates based on a trade-off between the width of an Or-function and the performance of the Or-function. For example, it is possible to configure the global bit line 19 into an one hundred and twenty-eight a wired-Or, but this would result in poor performance because the entire one hundred and twenty-eight word bit-line would have to be switched through the voltage change.

For performance and optimization, the individual Or-gates should be distributed vertically using a single metal line to connect the individual devices. The number of cells tied to a local bit line 32, the number of levels in the domino circuit, and the number of inputs of each of the Or-gates is determined by a trade-off between area and performance for a given number of words needed in a particular array. By proper design of the Or-gate tree and the ratioed inverter, performance can exceed that of a sense amplifier design with a significant decrease in power consumption.

Many domino circuit configurations are possible. The three following configurations serve as examples: 1) domino dynamic Or-gates with similarly distributed n channel transistors; 2) a NORA configuration with distributed n and p channel evaluation transistors; and 3) a pseudo static CMOS Nor-inverter combination (a pseudo static Nor consists of parallel n channel transistors with a grounded gate p channel pullup). For performance and power reasons, the two dynamic configurations are the preferred embodiments. Simulations of the NORA configuration have shown a twenty percent decrease in power consumption over traditional sense amplifier approaches, while maintaining almost a thirty percent speed advantage.

Although the present invention has been described in accordance with the embodiments shown, one of ordinary skill in the art will readily recognize that there could be variations to the embodiments and those variations would be within the spirit and scope of the present invention.

Accordingly, many modifications may be made by one of ordinary skill in the art without departing from the spirit and scope of the appended claims.

What is claimed is:

1. A domino random access memory comprising:
   a plurality of local cell groups, at least one of the plurality of local cell groups further comprising
      a plurality of core cells for storing information, and
      a local bit line coupled to the plurality of core cells;
   a domino circuit coupled to the local bit line for sensing information stored in the plurality of core cells;
   a precharge device coupled to the local bit line; and
   an inverter coupled to the local bit line, wherein the local bit line, the precharge device, and the inverter form a dynamic node for sensing information stored in the plurality of core cells and wherein the inverter is coupled to a tree hierarchy of Or-gates.

2. A domino random access memory as in claim 1 wherein the tree hierarchy of Or-gates comprises the inverter, an 8-way input-Or, and a 4-way input-Or.

3. A domino random access memory as in claim 2 wherein the inverter is a ratioed inverter.

4. A domino random access memory as in claim 3 wherein a Vdd signal is supplied to the domino random access memory for power, and the ratioed inverter is adjusted so that the ratioed inverter switches when the dynamic node reaches more than one-half of the Vdd signal.

5. A domino random access memory as in claim 4 wherein power is dissipated by the tree hierarchy of Or-gates only when a "1" is read from a one of the plurality of core cells.

6. A domino random access memory as in claim 5 wherein each one of the core cells includes:
   a word line;
   a first transistor coupled to the word line;
   a second transistor coupled to the word line and to the local bit line; and
   a cross-coupled inverter coupled between the first and second transistor, wherein the second transistor and the cross-coupled inverter are responsive to the word line to drive the local bit line.

7. A domino random access memory as in claim 6 wherein each one of the local cell groups comprise four core cells, and wherein the second transistor in each one of the core cells is coupled to the local bit line.

8. A domino random access memory as in claim 7 wherein the random access memory is a static random access memory.

9. A method for replacing a sense amplifier in a random access memory, wherein the random access memory includes a plurality of local cell groups coupled by a first and second global bit line, and each of the local cell groups includes a plurality of core cells each storing data and having a word line coupled across the first and second global bit lines for selecting a cell for reading, the method comprising the steps of:
   partitioning the second global bit line into local bit lines corresponding to each of the plurality of local cell groups;
   coupling an inverter to each of the local bit lines to create an dynamic node for sensing the data of a selected cell; and
   coupling the inverter to a tree hierarchy of Or-gates to output the data.

10. A method as in claim 9 wherein the inverter is a ratioed inverter.

11. A method as in claim 10 further including the steps of:
   providing a Vdd signal to the random access memory for power; and
   adjusting the ratioed inverter so that the ratioed inverter switches when the dynamic node reaches more than one-half of the Vdd signal.

12. A domino static random access memory, comprising:
   a plurality of local cell groups, each of the local cell groups including,
      a local bit line, and
      a plurality of core cells, wherein each of the core cells includes,
         a word line coupled to the local bit line,
         a first transistor coupled to the word line,
         a second transistor coupled to the word line and to the local bit line, and
         a cross-coupled inverter coupled between the first and second transistor,
      a precharge device coupled to the local bit line, and,
      a ratioed inverter coupled to the local bit line to form a dynamic node; and
   a tree hierarchy of Or-gates coupled to each of the ratioed inverters in the local cell groups.

13. A domino static random access memory as in claim 12 wherein the tree hierarchy of Or-gates comprises an 8-way input-Or followed by a 4-way input-Or.

14. A domino static random access memory as in claim 13 wherein a Vdd signal is supplied to the domino static random access memory for power, and the ratioed inverter is adjusted so that the ratioed inverter switches when the dynamic node reaches more than one-half of the Vdd signal.

15. A domino static random access memory as in claim 14 wherein power is dissipated by the tree hierarchy of Or-gates only when a "1" is read from a core cell.

* * * * *